United States Patent [19]

Ina

[11] Patent Number: 4,886,974

[45] Date of Patent: Dec. 12, 1989

[54] MARK DETECTING DEVICE FOR DETECTING THE CENTER OF A MARK BY DETECTING ITS EDGES

[75] Inventor: Hideki Ina, Kawasaki, Japan

[73] Assignee: Canon Kabushiki Kaisha, Tokyo, Japan

[21] Appl. No.: 336,551

[22] Filed: Apr. 11, 1989

Related U.S. Application Data

[63] Continuation of Ser. No. 921,102, Oct. 21, 1986, abandoned.

[30] Foreign Application Priority Data

Oct. 25, 1985 [JP] Japan .................. 60-237542

[51] Int. Cl.$^4$ ............................. G01N 21/86
[52] U.S. Cl. ..................... 250/561; 250/548; 356/400
[58] Field of Search .......... 250/548, 557, 561; 356/400, 401

[56] References Cited

U.S. PATENT DOCUMENTS

| 3,943,359 | 3/1976 | Matsumoto et al. | 356/400 |
| 4,504,148 | 3/1985 | Kuroki et al. | 250/557 |
| 4,663,534 | 5/1987 | Ayata et al. | 250/557 |
| 4,677,301 | 1/1987 | Tanimoto et al. | 250/548 |
| 4,688,088 | 8/1987 | Hamazaki et al. | 358/101 |

Primary Examiner—Edward P. Westin
Assistant Examiner—Khaled Shami
Attorney, Agent, or Firm—Fitzpatrick, Cella, Harper & Scinto

[57] ABSTRACT

A mark detecting device detects a mark in accordance with an electric signal obtained by photoelectrically converting the scatteringly reflected lights from edges of the mark. More particularly, the device detects the center of the mark in accordance with a photoelectrically obtained signal while taking, into account, the degree of asymmetry of the signal obtained at the time of optical scanning of the mark. By doing so, the center of the mark where it is formed on an object having a transparent surface layer, can be photoelectrically detected very accurately, substantially without being adversely affected by the transparent surface layer.

11 Claims, 8 Drawing Sheets

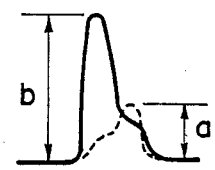
F I G. 5A     F I G. 5B
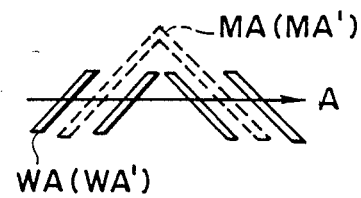
F I G. 6
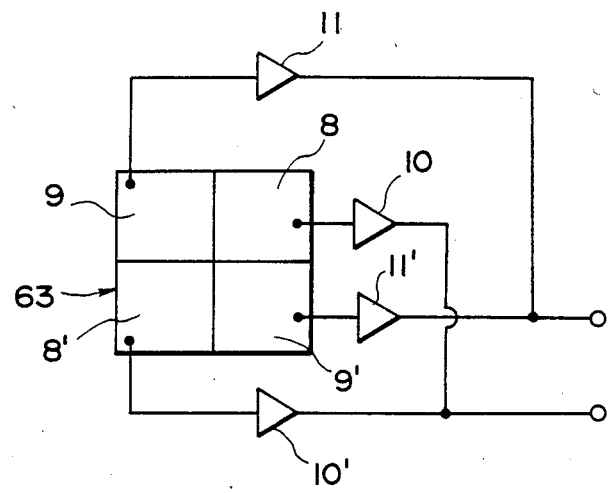
F I G. 7

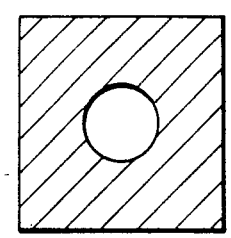
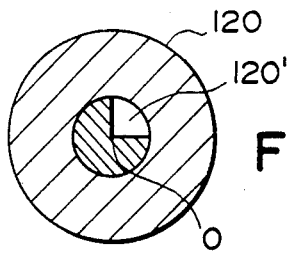
FIG. IIA
FIG. 10
FIG. IIB
FIG. IIC
FIG. IID
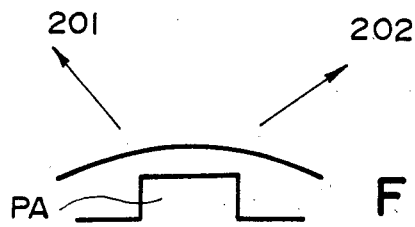
FIG. 12A
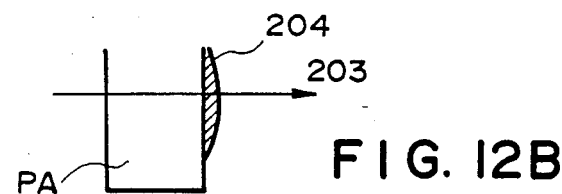
FIG. 12B

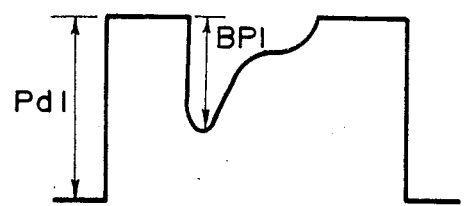
FIG. 13A
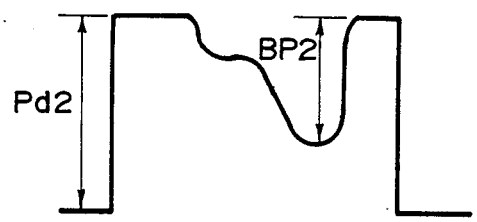
FIG. 13B
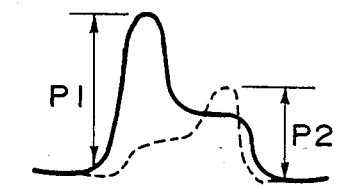
FIG. 14A
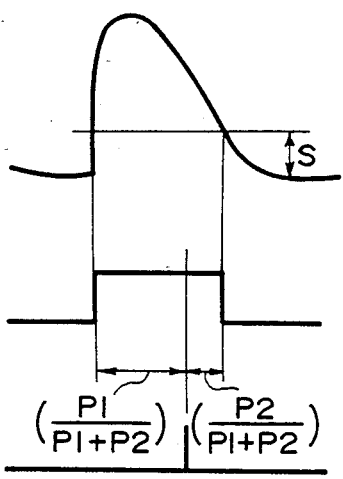
FIG. 14B
FIG. 14C
FIG. 14D

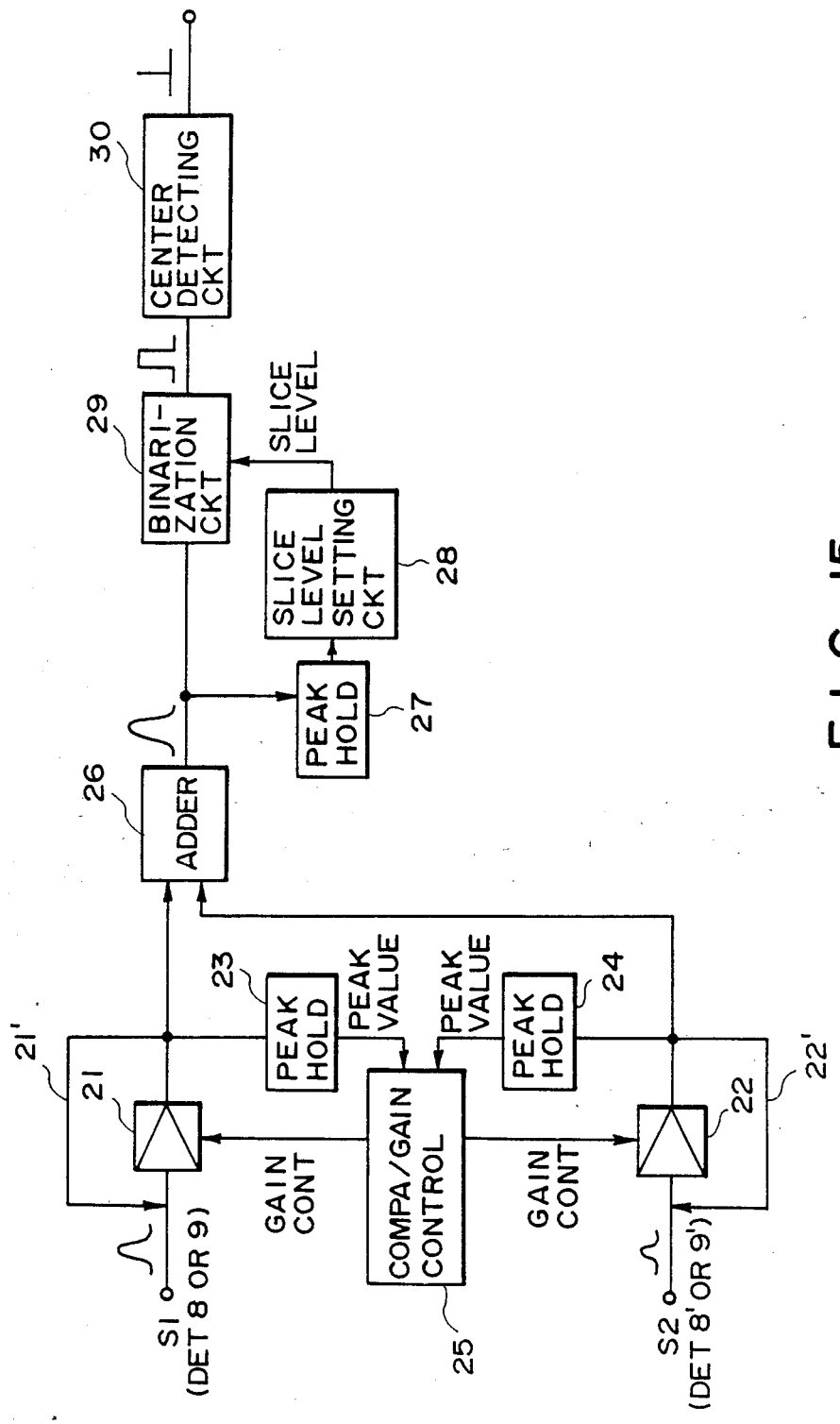
F I G. 15

MARK DETECTING DEVICE FOR DETECTING THE CENTER OF A MARK BY DETECTING ITS EDGES This application is a continuation of application Ser. No. 921,102 filed Oct. 21, 1986 now abandoned.

FIELD OF THE INVENTION AND RELATED ART

This invention relates to a mark detecting device and, more particularly, to a mark detecting device adapted to detect a mark formed on an object by use of information light from the mark.

The mark detecting device of the present invention is suitably applicable, e.g., to an alignment system in a semiconductor device manufacturing exposure apparatus, for bringing two objects such as a mask (or reticle) and a wafer into a predetermined positional relation. In view of this typical applicability, the invention will be described in this Specification with reference to mark detecting devices incorporated into such alignment systems.

In the field of manufacture of semiconductor devices such as integrated circuits and, more particularly, in the field of photolithography using alignment and exposure apparatuses, it is known that alignment marks formed on the mask (or reticle) and the wafer are scanned with a laser beam such that scatteringly or diffractively reflected light from the alignment marks is detected thereby to detect the positional relation between the mask and the wafer.

The alignment marks to be used for this purpose may be generally classified into two types. One is a mark which is formed by a linear pattern having a relatively large width. The other is a mark which is provided by a linear pattern having a narrow width. When the former is used, generally such means is provided that detects the diffractively reflected light from opposite edges of the mark to thereby obtain two pieces of positional information related to the edges of the mark, respectively. Where the latter is used, a single photodetector is employed to detect the diffractively reflected light from opposite edges of the mark pattern thereby to obtain one piece of positional information. Alternatively, as disclosed in U.S. Pat. No. 4,253,112, the edges of the mark pattern are detected independently of each other and, on the basis of this detection, a piece of positional information related to the center of the alignment mark (mark pattern) is detected.

In the lithographic process for the manufacture of semiconductor devices, a photoresist layer is usually provided on a wafer onto which a pattern is to be transferred. The presence of this photoresist layer often effects adversely upon the detection of alignment marks. To obviate such effect of the resist layer, a proposal has been made in U.S. Patent Application Ser. No. 642,760 filed August 21, 1984 and assigned to the assignee of the subject application. According to this proposal, a portion of the diffractively reflected light from an alignment mark which advances in a particular direction to be received by a photoelectric detector is selected, thereby to avoid mixture of noise light components into the information light.

SUMMARY OF THE INVENTION

The applicant of the subject application has found that, in addition to the problem considered in the aforementioned patent application, there is a problem of the effect of the resist layer upon detection of alignment marks. This will be described in detail. Usually an alignment mark is formed by a protrudent or etched pattern defined on or into the surface of a plate-like member such as a wafer. If there is a substantial difference in height between the wafer surface and the mark pattern, it is possible that, during coating of the wafer surface with a resist material, the resist material is unevenly applied to the wafer surface, with the result that a relatively large amount of resist is collected and remains in the close vicinity of one side edge of the alignment mark. Such phenomenon is schematically illustrated as hatched areas in FIG. 2. Where a single wavelength of light such as a laser or a narrow wavelength range of light is used at the time of alignment operation, the unevenly applied resist layer causes undesirable interference of the refractively reflected lights from one of the side edges of the alignment mark, which results in reduction in the quantity of light reaching the photoelectric detector. It appears that, in addition to the optical interference, optical refraction may relate to the reduction of the quantity of light coming from one side edge of the alignment mark. Such phenomenon can be observed where a light source which produces a narrow wavelength range of light is used as a source of light for observation. That is, the hatched areas in FIG. 2 will be observed as shaded areas.

The above-described phenomenon will be a bar to the mark detection particularly where the mark detection is effected by detecting side edges of the alignment mark and then detecting the center of the mark. More specifically, where optical signals (diffractively reflected lights) from the side edges of the alignment mark are photoelectrically converted into electric signals and these electric signals are combined with each other so as to detect the position of the mark, there is caused a substantial difference in intensity level between the optical signals from the edges of the alignment mark with the result that, when the electric signals corresponding to these optical signals are combined, the resultant signal has a waveform which is extraordinarily asymmetric. If this occurs, it is very difficult to detect accurately the position of the alignment mark by processing such resultant signal.

It is accordingly a primary object of the present invention to provide a mark detecting device which, when incorporated into an alignment system, is capable of avoiding alignment errors or less accurate alignment owing to an unevenly applied surface layer or resist layer. In a preferred embodiment of the present invention which will be described later, this object is achieved by detecting electrically the degree of unbalance of diffractively reflected lights from the edges of a mark.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 5A is an enlarged view schematically showing edge signals obtainable by photoelectric detection of edges of one mark element of the mark shown in FIG. 2.

FIG. 5B is an enlarged view schematically showing a mark signal obtainable by the photoelectric detection of one mark element of the mark shown in FIG. 2, in accordance with the embodiment shown in FIG. 1.

FIG. 6 is a schematic view showing the relation of a mask alignment mark and a wafer alignment mark when a mask and a wafer is aligned by use of the alignment system of FIG. 1.

FIG. 7 is a schematic and diagrammatic view of a detector used in the embodiment of FIG. 1.

FIG. 10 is a front elevational view of an aperture stop of known type.

FIGS. 11A-11D are schematic views showing an aperture stop used in the embodiment of FIG. 8 and the manner of setting the aperture stop.

FIGS. 12A and 12B are schematic views showing the effect of an unevenly applied resist layer upon the detection of the alignment mark shown in FIG. 9.

FIGS. 13A and 13B show waveforms of signals obtainable by photoelectric detection, per one scan line, relative to a mark portion shown in FIG. 12B.

FIGS. 14A-14D show another example of the manner of signal processing according to the principle of the present invention, which example differs from that shown in FIGS. 5A and 5B.

FIG. 15 is a diagrammatic view of a signal processing circuit which is adapted to execute the signal processing as illustrated in FIGS. 5A and 5B.

DESCRIPTION OF THE PREFERRED EMBODIMENTS

Figure 1:
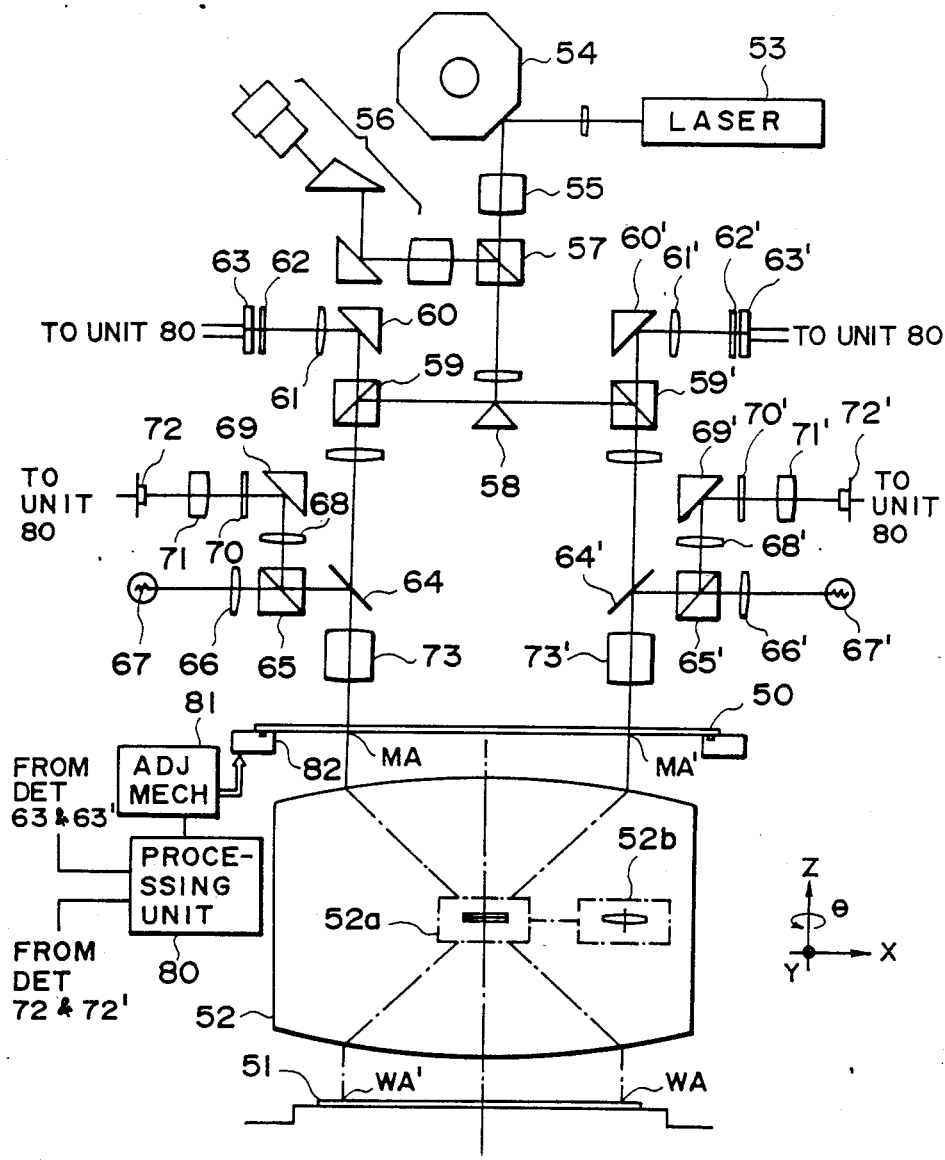
FIG. 1 is a schematic and diagrammatic view of an alignment system of a semiconductor device manufacturing exposure apparatus, in which a mark detecting device according to one embodiment of the present invention is incorporated.

Referring now to FIG. 1, there is shown an optical arrangement of an alignment system of a semiconductor device manufacturing exposure apparatus in which a mark detecting device according to one embodiment of the present invention is incorporated. Denoted in this Figure by numeral 51 is a wafer to be processed by the exposure apparatus illustrated. The wafer has alignment marks WA and WA' one of which is illustrated in an enlarged view of FIG. 2. As illustrated, the alignment mark WA comprises four inclined rectilinear mark elements 1a-1d each of which is defined, in this example, by a protrudent pattern formed on the surface of the wafer 51. As described in the foregoing and as illustrated by the hatched areas 2a-2d in FIG. 2, a relatively large amount of resist material is collected in a region close to one side edge of each mark element of the alignment mark WA and therefore, in this region, the diffractively reflected lights from the particular edge of the element mark will interfere with each other.

Figure 2:
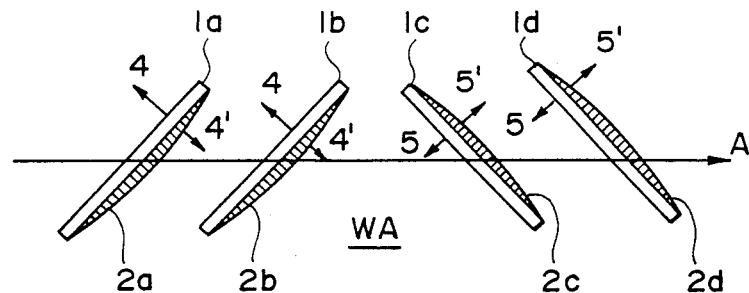
FIG. 2 is a schematic view showing the effect of an unevenly applied resist layer upon the detection of an alignment mark which is provided on a wafer to be used in the exposure apparatus of FIG. 1.
Figure 3:
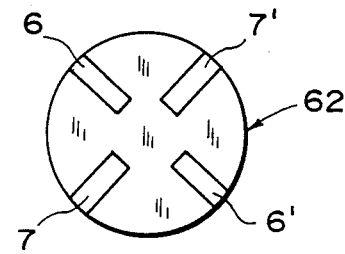
FIG. 3 is a front view of a spatial filter used in the alignment system shown in FIG. 1.

For the mark detection, the alignment mark WA is scanned with a laser beam in a direction of an arrow A. When, during scan of the mark WA, the laser beam is incident on the mark elements 1a-1d of the alignment mark WA, the laser beam is scatteringly or diffractively reflected by each of the edges of the mark elements 1a-1d. The thus reflected lights advance in the directions denoted by arrows 4, 4', 5 and 5' in accordance with the inclination of each element mark relative to the line of scan (direction A) by the laser beam. FIG. 3 is an enlarged view of a spatial filter 62 which is used to detect, in a dark field, the edges of the mark elements 1a-1d of the alignment mark WA. The filter 62 has four light-transmitting sections 6, 6', 7 and 7' which correspond to the advancing directions 4, 4', 5 and 5' of the diffractively reflected lights from the edges of the mark elements 1a-1d shown in FIG. 2. More specifically, the light beams advancing in the direction of arrow 4 pass through the light-transmitting section 6; the light beams advancing in the direction of arrow 4' pass through the light-transmitting section 6'; the light beams advancing in the direction of arrow 5 pass through the light-transmitting section 7; and the light beams advancing in the direction of arrow 5' pass through the light-transmitting section 7'.

Figure 4A:
FIGS. 4A-4C show waveforms of signals obtainable by photoelectric detection of the mark shown in FIG. 2.
Figure 4B:
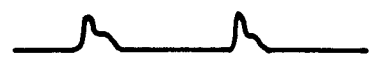
Figure 4C:

By photoelectrically converting the lights passed through the spatial filter 62, an alignment signal comprising four mark signals in this embodiment is obtained. A typical example of such alignment signal is illustrated in FIG. 4A. The illustrated example is one which is obtained by sequentially introducing, to a four-division detector 63 shown in FIG. 7, the diffractively reflected lights from the mark elements 1a and 1b (FIG. 2) and passed through the light-transmitting sections 6 and 6' of the spatial filter 62 (FIG. 3) and, then, by sequentially introducing, to the same four-division detector 63, the diffractively reflected lights from the mark elements 1c and 1d and passed through the light-transmitting sections 7 and 7' of the spatial filter 62. As illustrated in FIG. 7, the four-division detector 63 includes four photodetecting sections 8, 8', 9 and 9' which are electrically isolated from each other. The photodetecting section 8 is adapted to effect photoelectric conversion relative to the light beams passed through the light-transmitting section 6. Similarly, the photodetecting sections 8', 9 and 9' are adapted to effect photoelectric conversion relative to the light beams passed through the light-transmitting sections 6', 7 and 7', respectively. FIG. 4B shows waveforms of electric signals obtained by the photoelectric conversion which is made by the photodetecting section 8 relative to the light beams diffractively reflected, in the direction of arrow 4, from the edges of the mark elements 1a and 1b of the alignment mark WA. On the other hand, FIG. 4C shows waveforms of electric signals obtained by the photoelectric conversion which is made by the photodetecting section 8' relative to the light beams diffractively reflected, in the direction of arrow 4', from the other edges of the same mark elements 1a and 1b of the alignment mark WA. When a first one (left-hand one) of the peaks included in the signal waveform view of FIG. 4B is combined with a first one (left-hand one) of the peaks included in the signal waveform view of FIG. 4C, a first peak in the signal waveform view of FIG. 4A is obtained. Such resultant signal (peak) is used as a "mark detection signal" (hereinafter "mark signals") with respect to the mark element 1a of the alignment mark WA shown in FIG. 2. The waveforms of the first peaks included in the signal waveform views of FIGS. 4B and 4C, respectively, are illustrated in an enlarged view of FIG. 5A. In this Figure, a solid line depicts a signal obtained by the photoelectric conversion having been made to the light passed through the light-transmitting section 6 of the spatial filter 62, while a broken-line depicts a signal obtained by the photoelectric conversion having been made to the light passed through the light-transmitting section 6' of the spatial filter.

It is seen from FIG. 5A that one of the signals which corresponds to such one of the edges of the element mark 1a that is covered by or contiguous to the collected portion of the resist material (in the hatched area 2a in FIG. 2), has a decreased output level as compared with the output level of the other signal. More particularly, the level of the signal denoted by the broken-line is significantly lower than that of the signal denoted by the solid line. The decrease in the output level is due to the reduction in the quantity of light incident on the corresponding photodetecting section of the four-division detector, resulting from the occurrence of the interference in the region 2a. Due to such substantial difference or unbalance in level of the two signals (edge signals), combining these signals will produce a signal having a waveform which is significantly distorted as illustrated in FIG. 4A. That is, the waveform of the resultant signal (mark signal) obtained by combining the two edge signals shown in FIG. 5A has a low degree of symmetry as compared with that shown in FIG. 5B. For this reason, when such mark signal is binarized to detect the position of the mark element, and if the slice level for the binary-coding is not suitably set, the position of the center of a pulse (binary-coded signal) obtainable by the binarization is deviated from the center of the mark signal with respect to the width thereof. Thus, the center of the pulse signal does not correspond to the center of the mark element 1a.

In accordance with a preferred embodiment of the present invention, in view of the foregoing problem, means are provided to control an amplification rate relative to each of the signals obtainable by the photoelectric conversion at the photodetecting sections of the four-division detector, such that the signals from the photodetecting sections have substantially the same peak values. In the embodiment shown in FIG. 1, variable amplifiers such as denoted by numerals 10, 10', 11 and 11' in FIG. 7 are provided and their amplification rates are controlled so that the signals obtained by the photoelectric conversion at the photodetecting sections 8–9' relative to the light beams passed through the light-transmitting sections 6–7' of the spatial filter, have substantially the same peak values. In the example of FIG. 5A, the amplification rate relative to the edge signal corresponding to the light passed through the light-transmitting section 6' of the spatial filter is increased by b/a times, as compared with that for the edge signal corresponding to the light passed through the light-transmitting section 6 of the spatial filter. By doing so, a mark signal having a waveform of superior symmetry such as illustrated in FIG. 5B is obtainable. Therefore, when the mark detection signal is binarized, a pulse signal (binary-coded signal) having a center which accurately corresponds to the center of the mark element (e.g. 1a) is obtainable. Consequently, high-accuracy detection of the alignment mark WA and thus high-accuracy alignment using the alignment mark WA are assured. Of course, substantially the same effect is attainable by changing, by a/b times, the amplification rate relative to the signal corresponding to the light passed through the light-transmitting section 6 of the spatial filter. An example of signal processing circuit suitable for effecting the signal processing in the manner described above, is illustrated in FIG. 15. Details of this will be described later.

The four-division (four-channel) sensor 63 is disposed just after the spatial filter 62 such as shown in FIG. 1. By this, the light beams passed through the transmitting sections 6, 6', 7 and 7' of the spatial filter 62 are photoelectrically converted by the detecting sections 8, 8', 9 and 9' of the sensor 63, independently of each other. In the illustrated example, the signals from the detecting sections and 8' (9 and 9') are combined after being amplified at the controlled amplification rates, whereby the mark element 1a, 1b, 1c or 1d is detected.

Referring back to FIG. 1, denoted by numeral 50 is a mask having alignment marks MA and MA' and a pattern which is to be transferred onto the wafer 51. A projection lens 52 is provided to project, at a unit magnification or in a reduced scale, an image of the pattern of the mask 50 onto the wafer 51 so that the wafer 51 is exposed to the pattern of the mask 50 with radiation such as light emitted from an illumination source, not shown in this Figure. Where different wavelengths of lights are used for the alignment operation and for the exposure operation, a quarter waveplate 52a is introduced into the projection lens system 52 upon the alignment operation, whereas a lens system 52b is interchangingly introduced into the projection lens system 52 upon the exposure operation. The lens system 52b is prepared in order to compensate for undesirable focus deviation due to the difference in the wavelength of the lights used in the alignment operation and the exposure operation. On the other hand, the quarter waveplate 52a is provided in order to separate the light reflected from the mask surface and the light reflected from the wafer surface from each other, in accordance with the direction of polarization. Where the same wavelength of light is used for the alignment operation and the exposure operation, or where the projection lens system 52 is one in which the aberrations are corrected with respect to two different wavelengths, use of the lens system 52b is not necessary. Thus, the quarter waveplate 52a may be fixedly secured.

It will be understood from FIG. 6 that, in the present embodiment, the mask alignment marks MA and MA' provided on the mask 50 have the same configuration and, on the other hand, the wafer alignment marks WA and WA' provided on the wafer 51 have the same configuration. Also, as will be seen from FIG. 1, the mask alignment marks MA and MA' of the mask 50 are formed at symmetrical positions with respect to the optical axis of the projection lens system 52. Similarly, the wafer alignment marks WA and WA' of the wafer 51 are provided symmetrically with respect to the optical axis of the projection lens system 52.

Denoted in FIG. 1 by numeral 53 is a laser source for producing a laser beam which is linearly polarized in a direction perpendicular to the sheet of the drawing (i.e. in the direction of the Y axis). Polygonal mirror 54 is rotatable at a constant speed. An f-$\theta$ lens 55 is effective to achieve constant-speed scan of the mask 50 surface and the wafer 51 surface with the laser beam from the source 53. Denoted by numeral 56 is an observation system; and by 57, a beam splitter. A prism 58 is provided to divide the scanning range. More particularly, the prism 58 is adapted to divide "one scan" by the laser beam into a first half and a second half, these halves being applied to scan the alignment marks MA and WA; MA' and WA', respectively. The components following the prism 58 constitute a left-hand side subsystem and a right-hand side subsystem, these subsystems having symmetrical arrangement. The elements of the right-hand side subsystem are denoted by the same reference numerals, with primes, as of those are the left-hand side subsystem. For the sake of simplicity, description will be made only to the left-hand side subsystem.

Denoted by numeral 59 is a polarization beam splitter which is adapted to reflect or transmit the light incident thereon, in accordance with the state of linear polarization of the entered light (i.e. in accordance with the plane of polarization). Denoted by numeral 60 is a reflector for bending the optical path; by 61, a condenser lens; by 62, the spatial filter described in the foregoing; and by 63, the four-division detector also described in the foregoing. The light-transmitting sections 6–7' of the spatial filter 62 are defined in accordance with the directions of the mark elements 1a–1d of the wafer alignment mark WA (WA'). Also, the sensitive regions (photodetecting sections) 8–9' of the detector 63 are set in accordance with the light-transmitting sections 6–7' of the filter 62, such that they receive the light beams from the wafer 51. Denoted by numeral 64 is a half mirror having a small reflection factor; by 65, a polarization beam splitter; by 66, a condenser lens; and by 67, a light source for producing a light for observation. There are also provided a relay lens 68, a reflector 69, a spatial filter 70, a condensing lens 71 and a photoelectric converting element 72 which is adapted to receive the light from the mask 50. A microscopic objective lens (hereinafter simply "objective lens") 73 is positioned so that the alignment marks MA and WA of the mask 50 and the wafer 51 are included in the viewfield of the objective lens.

In operation, the laser beam from the laser source 53 is incident on the polygonal mirror 54 by which it is scanningly deflected. The deflected laser beam is converted by the f-θ lens 55 into a laser beam adapted to scan the mask and the wafer at a constant speed. Then, the laser beam passes through the beam splitter 57 and is incident on the prism 58. During the first half, for example, the laser beam is reflected by the left-hand inclined surface of the prism 58 and is directed leftward. During the second half, it is reflected by the right-hand inclined surface of the prism 58 so that it is directed rightward. The laser beam reflected by the prism 58 is again reflected by the polarization beam splitter 59 (59') and passes through the half mirror 64 (64'). Thereafter, the laser beam enters into the objective lens 73 (73') so that it is focused on the mask 50. The laser beam passed through the mask 50 is again focused on the wafer 51 by the projection lens system 52. By this arrangement, the mask 50 and the wafer 51 are scanned with the laser beam. The light diffractively reflected by the alignment mark MA (MA') of the mask 50 enters into the objective lens 73 (73') and then is reflected by the half mirror 64 (64'). At this time, a portion of the light passes through the half mirror 64 (64') toward the four-division detector 63 (63') provided for the sake of detection of the wafer alignment mark. However, the light directed to the detector 63 is one which is linearly polarized in the direction perpendicular to the sheet of the drawing. Therefore, it is blocked by the polarization beam splitter 59 (59'). The light reflected by the half mirror 64 (64') is incident on the polarization beam splitter 65 (65') which is adapted to reflect the light from the mask 50 that is linearly polarized in the direction perpendicular to the sheet of the drawing but to block noise components (i.e. the light from the wafer 51 which is one linearly polarized in a direction parallel to the sheet of the drawing). The reflected light from the polarization beam splitter 65 is transmitted and reflected by the relay lens 68 (68') and the reflector 69 (69'), respectively. Thereafter, the specularly reflected component of the light from the mask 50 is intercepted by the spatial filter 70 (70'), whereas the scatteringly reflected component, having been scattered by the edges of the mark elements of the mask alignment mark MA (MA') is condensed by the condenser lens 71 (71'). As a result, it is incident on the photoelectric converting element 72 (72'), whereby an alignment signal related to the mask is produced.

On the other hand, the laser beam passed through the mask 50 from the above arrangement is incident on the quarter waveplate 52a when it is refractively transmitted by the projection lens system 52. By this quarter waveplate 52a, the laser beam is converted into a circularly polarized light. Then, it is incident on the wafer 51 surface so that the same is scanned. The light reflected by the alignment mark WA (WA') on the wafer 51 passes again through the quarter waveplate 52a in the opposite direction, such that it is converted into a linearly polarized light whose phase is rotated by 90 degrees as compared with that of the light having been incident on the quarter waveplate 52a from the above. Then, the light from the wafer 61 passes through the objective lens 73 (73') and the half mirror 64 (64') and is incident on the polarization beam splitter 59 (59'). Since the light reflected from the wafer 51 has been linearly polarized, by the quarter waveplate 52a, in the direction parallel to the sheet of the drawing, it is transmitted through the polarization beam splitter 59 (59') and, after being reflected and condensed by the reflector 60 (60') and the condensing lens 61 (61'), respectively, is incident on the spatial filter 62 (62'). Thus, the diffractively reflected light beams from the wafer alignment mark WA (WA') pass through the light-transmitting sections 6–7' and are incident on the four-division detector 63 (63').

A processing unit 80 is adapted to extract appropriate portions of the output signals from the four-division detector 63 (63') thereby to determine an alignment signal related to the wafer 51. For this purpose, the sensing regions of the four-division detector 63 (63') may be operated in sequence or, alternatively, suitable memory means may be used to temporarily stored the output signals form the four sensing regions of the detector 63 (63') so that the extraction is effected thereafter. It is a further possible alternative to determine the alignment signal in a way like the combination of the aforesaid two methods. On the basis of the thus determined alignment signal related to the wafer 51 and the alignment signal related to the mask 50 and obtained from the photoelectric converting element 72 (72'), the processing unit 80 carries out predetermined calculations. Then, in accordance with the results of calculations (i.e. the detected positional errors in the directions of X, Y and θ), the processing unit 80 drives a position adjusting mechanism 81 to move a mask chuck 82, holding the mask 50, whereby the mask 50 and the wafer 51 are aligned with respect to each other. In place of moving the mask 50, the wafer 51 may of course e moved.

The processing unit 80 includes amplifiers, such as at 10, 10', 11 and 11' in FIG. 7, each having a variable amplification rate. The amplification rates of these amplifiers are controlled so that the output signals from the diagonally opposed detecting regions 8 and 8' (9 and 9') of the detector 63 (or 63') have substantially the same peak levels, as described in the foregoing. As a result of such control, the output signals of the detecting regions 8 and 8' (9 and 9') will produce, when combined, a waveform having good symmetry such as illustrated in FIG. 5B. Thus, when the signal having such waveform is binarized with an appropriate slice level, the center of the resultant pulse (obtainable by the binarization) corresponds exactly at the center of the mark element 1a, 1b, 1c or 1d of the alignment mark WA (WA'). Therefore, the position of the alignment mark WA (WA') can be detected very accurately.

While, in the foregoing, the present invention has been described with reference to embodiments in which the mark is scanned by a laser beam and is detected in a dark field, the present invention is not limited thereto. It will be readily understood that, according to the concept of the present invention, substantially the same advantageous effects (i.e. high-accuracy position detection or alignment) are attainable in the case of bright-field detection.

Figure 8:
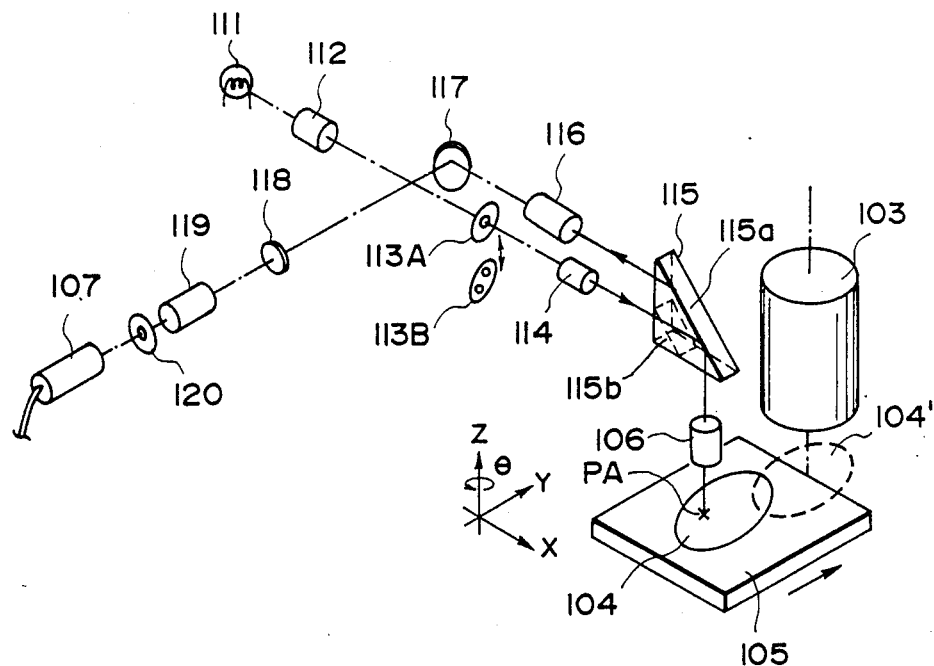
FIG. 8 is a perspective view schematically showing a mark detecting device according to another embodiment of the present invention.

Furthermore, the principle of mark detection of the present invention is suitably applicable to a position detecting device using a TV system, such as disclosed in Japanese Laid-Open Patent Application, Laid-Open No. 100532/1984 filed by the assignee of the subject application. FIG. 8 of the drawings shows such a case. More particularly, FIG. 8 illustrates a mark detecting device of the present invention which is incorporated into a TV prealignment system included in the exposure apparatus of FIG. 1.

Denoted in FIG. 8 by numeral 103 is a projection lens system for projecting, onto a wafer 104, an image of a mask pattern (not shown) at a unit magnification or in a reduced scale. Denoted by numeral 106 is an objective lens; by 107, an image pickup tube; by 111, a light source for illumination which comprises, in this embodiment, a halogen lamp; by 112, a condenser lens; by 113A, an aperture stop for bright-field detection; and by 113B, an aperture stop for dark-field detection. The aperture stops 113A and 113B are used interchangingly. In the state illustrated, the aperture stop 113A is introduced into the optical path, so that an image of the light source 111 is formed on this aperture stop 113A by the condenser lens 112. Denoted by numeral 114 is a relay lens for illumination; and by 115, a cemented prism having an inner reflecting surface 115a and a semi-transmitting reflecting surface 115b. The light source 111, the condenser lens 112, the aperture stops 113A and 113B, the relay lens 114, the prism 115 and the objective lens 106 cooperate with each other to constitute an illumination system. The light emerging from the objective lens 106 is perpendicularly incident on the whole area of a prealignment mark PA formed on the wafer 104.

Figure 9:
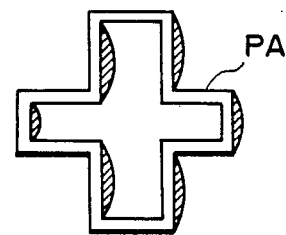
FIG. 9 is a schematic view illustrating the effect of an unevenly applied resist layer upon the detection of an alignment mark provided on a wafer to be used in the embodiment of FIG. 8.

Denoted in FIG. 8 by numeral 116 is a relay lens; by 117, a mirror for bending the optical path; and by 118, a glass plate having a reference mark for the TV prealignment. The reference mark defines an origin of coordinates. Thus, the prealignment mark PA is detected as a position with respect to the X-Y coordinates. Denoted by numeral 119 is an erector lens. The above-described prism 115, relay lens 116, mirror 117 glass plate 118, erector lens 119 and image pickup tube 107 cooperate with each other to constitute a light-receiving system. The cemented prism 115 thus functions to combine (or bring into coaxial relation) the optical axes of the illumination system and the light-receiving system. The light passed through the objective lens 106 is reflected by the inner reflecting surface 115a and the semi-transmitting surface 115b of the prism 115 and, then, is again reflected by the inner reflecting surface 115a so that it is directed to the relay lens 116. Thus, an image of the prealignment mark PA of the wafer 104 is formed on the glass plate 118 on which the reference mark is provided. Thereafter, the image of the prealignment mark PA as well as the image of the reference mark are formed on an image pickup surface of the image pickup tube 107.

Where a cross mark such as shown in FIG. 9 is used as the prealignment mark PA, it is possible, also in this case, that there occurs difficulties in the mark detection described hereinbefore due to unevenness in the resist coating on the wafer 104 surface, particularly in the vicinity of the edges of the mark. The uneven coating is schematically illustrated in FIG. 9 by hatched areas.

In this embodiment, such difficulties in the mark detection are avoided. For this purpose, an additional aperture stop 120 is disposed between the erector lens 119 and the image pickup tube 107. The aperture stop 120 used in this embodiment has a shape such as shown in FIG. 11A and is made rotatable. By controlling the rotational position of the aperture stop 120, the gain at the time of combining video signals is changed. Details of this will be described below.

FIG. 10 shows an example of known type aperture stop. The inner circle depicts the boundary of the aperture, restricting the numeral aperture (NA) with reference to optical signals to be picked up. Referring to FIG. 11A, the aperture stop 120 used in the present embodiment has a light-transmitting portion 120' which substantially corresponds to a quarter of the light-transmitting portion of the conventional aperture stop shown in FIG. 10. It will be readily understood that, when the aperture stop 120 of the present invention is used, only a portion of the diffractively reflected light from the edges of the wafer prealignment mark PA that advances in a particular direction (i.e. that is distributed with a particular angular range), reaches the image pickup tube 7. Video signals from the image pickup tube 7 are stored into suitable memory means, not shown. Thereafter, while changing the rotational position of the aperture stop 120 in steps, each by 90 degrees as will be seen from FIGS. 11A–11D, video signals obtained for the respective rotational positions of the aperture stop 120 are stored into the memory means. If, with respect to two different and diagonally opposed positions of the light-transmitting portion 120' (such as the positions shown in FIGS. 11A and 11C; or the positions shown in FIGS. 11B and 11D), the video signals corresponding to the edges of the prealignment mark PA have significantly different levels, the gain control is made in the manner described hereinbefore so that the video signals have substantially the same output levels. This is done for the bright field detection and also for the dark field detection.

By doing so, the signals to be combined are balanced in good order, and whereby high-accuracy position detection is ensured. The rotational displacement of the aperture stop 120 may be replaced by interchangingly using four aperture-stop plates. Alternatively, liquid crystal shutter means may be used. Moreover, in place of the gain control described above, the quantity of light emission from the light source 111 may be controlled in accordance with the position of the light-transmitting portion 120', so that the video signals when the aperture stop 120 is in the FIG. 11A position and in the FIG. 11C position have substantially the same peaks while, on the other hand, the video signals when the aperture stop 120 is in the FIG. 11B position and in the FIG. 11D position have substantially the same peaks.

FIG. 12A is a sectional view of the prealignment mark PA, and FIG. 12B is a plan view thereof. FIGS. 13A and 13B show bright-field detection signals obtained by scanning the mark PA in the direction of an arrow 203 shown in FIG. 12B. More specifically, FIGS. 13A and 13B show waveforms of video signals which are obtained when the aperture stop 120 is set so that only the diffractively reflected lights that advance in the directions of arrows 201 and 202 in FIG. 12A, respectively, are detected. As illustrated in FIGS. 13A and 13B, these waveforms include pedestals PD1 and PD2, and there is a difference between peaks BP1 and BP2 corresponding to the edges, respectively. If in this case BP2>BP1, then the signal shown in FIG. 13A is amplified in a processing unit, not shown, by an amount corresponding to BP2/BP1. At this time, the pedestal Pd1 is also amplified by an amount corresponding to BP2/BP1. It is therefore necessary that, when the two signals are going to be combined, the level of the signal obtained as a result of amplification of the FIG. 13A signal by an amount BP2/BP1, is lowered so that the two signals have substantially the same pedestals. And, after this, the two signals are combined. By improving the degree of balance between the peaks BP1 and BP2 in the manner described hereinbefore, a pulse which is obtainable by combining the two signals and by binary-coding the resultant signal with a suitable slice level, has a center exactly corresponding to the center of the mark PA (i.e. the middle between the edges of the mark). As a result, the position of the prealignment mark PA can be detected very accurately. As for the dark field detection, the mark can be detected in a way substantially the same as that in the case of laser beam scanning described before.

In the foregoing embodiments, the gains relative to the signals photoelectrically detected from the edges of the mark are controlled independently. And, the signals are combined into one detection signal which is thereafter binarized to obtain a pulse signal center is used to determine the center of which of the mark element. However, substantially the same advantageous effects are attainable without the gain control described above. This will now be described in detail with reference to FIGS. 14A–14D.

FIG. 14A shows signal waveforms obtained by scanning, with light, the mark PA shown in FIG. 12B. That is, the mark PA is scanned in the direction 203 with a laser beam or by use of the image pickup tube. Then, the diffractively reflected lights advancing in the directions 201 and 203, respectively, are photoelectrically converted into electric signals. If, in this case, a photoresist material is unevenly collected in a region 204 which is downstream of the trailing edge of the mark PA with respect to the direction of scan, there occurs a difference between peaks of the photoelectrically detected signals corresponding to the edges of the mark PA, such as depicted by a solid line and a broken-line in FIG. 14A. That is, P1≠P2. As a result, when these signals having peaks P1 and P2 are combined, the resultant signal has a waveform which is distorted such as illustrated in FIG. 14B. When this signal is binarized with a slice level S, a pulse signal shown in FIG. 14C is obtainable. Then, in the present embodiment, the width of the thus obtained pulse signal is proportioned or proportionally distributed in accordance with the proportions of the peaks P1 and P2. Namely, as illustrated in FIG. 14D, the point which is at a distance P1/(P1+P2) from the leading edge of the pulse signal, with respect to the width thereof, is determined as the center of the mark PA. An example of signal processing system for executing the signal processing in the manner described above is shown in FIG. 16. Details of such signal processing system will be described later.

Referring now to FIG. 15, there is shown an example of signal processing system suitable for executing the signal processing in the manner described with reference to the apparatus of FIG. 1. In the example of FIG. 15, the system is arranged to improve the degree of balance of the signals, as described hereinbefore, so that the center of one mark element (1a or the like) shown in FIG. 2 is detected on the basis of the "center" of the detection signal. In FIG. 15, denoted by character S1 is a photoelectrically converted signal which is outputted from the detecting region 8 (or 9) of the four-division detector 63 shown in FIG. 7. Similarly, denoted by character S2 is a photoelectrically converted signal which is outputted from the detecting region 8' (or 9') of the detector 63. These signals S1 and S2 are applied to variable-gain amplifiers 21 and 22, respectively and, then, peaks of these signals are detected by peak holding circuits 23 and 24, respectively. A comparing and gain-controlling circuit 25 (hereinafter "gain control circuit") is adapted to compare the peak value of the signal S1 from the peak holding circuit 23 with the peak value of the signal S2 from the peak holding circuit 24. Also, the gain control circuit 25 controls, in accordance with the result of comparison, the gains of the variable-gain amplifiers 21 and 22 in the manner described hereinbefore. More particularly, the gain control circuit 25 controls the gains of the amplifiers 21 and 22 so that the peak values of the signals S1 and S2 outputted from the amplifiers 21 and 22 become substantially equal to each other. As for the signals S1 and S2 to be amplified by the amplifiers 21 and 22 whose gains are controlled as above, the signals obtainable by feeding back, by way of memory means (not shown) along respective feedback lines 21' and 22', the signals whose peaks have been detected at the peak holding circuits 23 and 24, respectively, are usable. Alternatively, they may be the signals to be outputted from the detecting regions 8 and 8' (9 and 9') of the detector 63 in response to the subsequent laser beam scanning.

The signals S1 and S2 now having substantially the same peak values, under the influence of the amplifiers 21 and 22, are added to each other in an adder 26. Thereafter, the resultant signal is binary-coded with a predetermined or suitable slice level by a binarization circuit 29. The slice level for this binarization is determined by the slice level setting circuit 28. More particularly, the slice level setting circuit 28 is arranged to determine the slice level in accordance with a peak value of the mark signal from the adder 26 (i.e. the signal obtained by combining the signals S1 and S2), the peak value being detected by a peak holding circuit 27.

In this manner, the mark signal is binarized by the binarization circuit 29, whereby a pulse signal corresponding to the mark signal is produced. This pulse signal is supplied to a center detecting circuit 30. The circuit 30 is arranged to detect the center of the supplied pulse signal with respect to the width thereof and, in this embodiment, the thus detected center of the pulse signal exactly corresponds to the center of the mark signal and thus the center of the element mark 1a, 1b, 1c or 1d, as described hereinbefore. In this manner, an output signal, bearing accurate positional information about the center of the element mark, is produced from the center detecting circuit 30. The operation using such positional information have been described with reference to the embodiment of FIG. 1.

Figure 16:
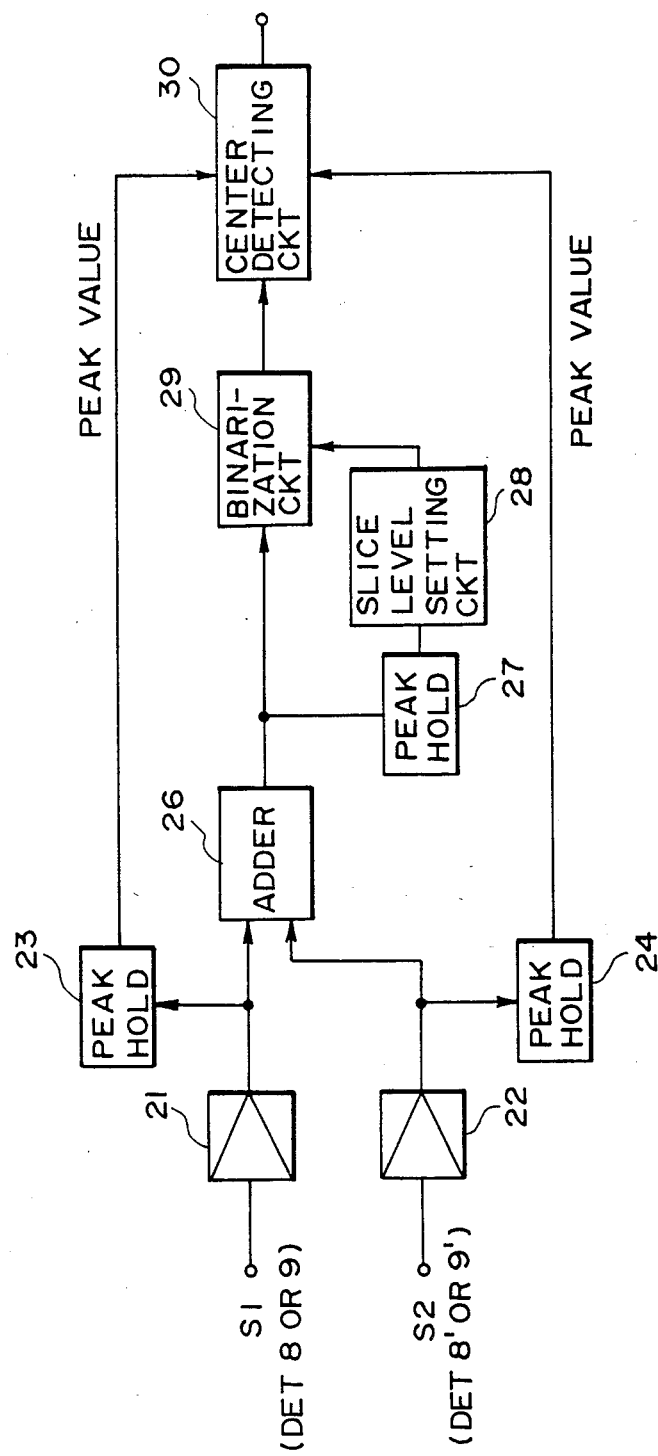
FIG. 16 is a diagrammatic view of a signal processing circuit which is adapted to execute the signal processing as illustrated in FIGS. 14A-14D.

Referring now to FIG. 16, there is shown an example of signal processing system arranged to execute the signal processing in the manner described with reference to FIGS. 14a–14d. Elements like those in the FIG. 15 example are denoted by the same reference numerals. In the example of FIG. 16, the peaks of the signals S1 and S2 which are detected by the peak holding circuits 23 and 24, respectively, are applied directly to the center detecting circuit 30. The circuit 30 is arranged to detect the center of the mark signal (i.e. the output of the adder 26) by proportioning or proportionally distributing an output pulse of the binarization circuit 29 in accordance with the proportions of the peak values detected at the peak holding circuits 23 and 24, i.e.

[P1/(P1+P2)]:[P2/(P1+P2)]

The remaining portion of the FIG. 16 system has substantially the same structure as of the corresponding portion of the FIG. 15 example. In the FIG. 16 example, however, each of the amplifiers 21 and 22 may be of a type other than the variable-gain type.

In accordance with the present invention, as has hitherto been described, a mark on an object having a transparent surface layer can be accurately detected, without being adversely affected by the transparent surface layer. Therefore, where the present invention is applied to an alignment system in a semiconductor device manufacturing apparatus, the alignment accuracy can be improved significantly.

While the invention has been described with reference to the structures disclosed herein, it is not confined to the details set forth and this application is intended to cover such modifications or changes as many come within the purposes of the improvements or the scope of the following claims.

What is claimed is:

1. A device for detecting a mark having edges and being provided on an object, said device comprising:
    edge detecting means for detecting the edges of the mark and for producing edge signals corresponding respectively to the edges of the mark;
    mark detecting means, responsive to said edge detecting means, for detecting a position of the mark on the basis of the edge signals produced by said edge detecting means;
    peak detecting means for detecting the peaks of each of the edge signals produced by said edge detecting means; and
    control means for controlling the position detection by said mark detecting means, in accordance with the peaks of the edge signals detected by said peak detecting means,
    wherein said mark detecting means includes adding means for combining the edge signals produced by said edge detecting means and for generating a resultant signal therefrom, and signal processing means for processing the resultant signal generated by said adding means to detect the position of the mark, and wherein said control means controls signal processing by said signal processing means in accordance with the detected peaks of the edge signals.

2. A device for detecting a mark having first and second edges, said device comprising:
    detecting means for detecting first and second signals related to the first and second edges of the mark, respectively;
    adding means for adding the detected first and second signals and for producing a resultant signal; and
    signal processing means for processing the resultant signal in accordance with any difference between the first and second signals, to determine the position of the mark.

3. A device according to claim 2, further comprising a detecting circuit for detecting peaks of the first and second signals, respectively, and wherein said signal processing means processes the resultant signal in accordance with any difference between the peaks of the first and second signals detected by said detecting circuit.

4. A device according to claim 2, wherein said signal processing means includes a binary-coding circuit for binarizing the resultant signal produced by said adding means, such that the resultant signal which is in the form of a binary-coded signal is processed by said signal processing means in accordance with said difference.

5. A device according to claim 3, wherein said signal processing means includes a binary-coding circuit for binarizing the resultant signal produced by said adding means, such that the resultant signal which is in the form of a binary coded signal is processed by said signal processing means in accordance with said difference.

6. A device according to claim 5, wherein said signal processing means operates to determine the position of the mark on the basis of a binary-coded resultant signal and a ratio of peaks of the first and second signals.

7. A method of detecting a mark having first and second edges, comprising the steps of:
    detecting first and second signals related to the first and second edges of the mark, respectively;
    adding the detected first and second signals and producing a resultant signal; and
    processing the resultant signal in accordance with any difference between the first and second signals to determine the position of the mark.

8. A method according to claim 7, wherein said processing step includes binary-coding the resultant signal and processing the resultant signal which is in the form of a binarized signal, in accordance with any difference in peak of the first and second signals, to determine the position of the mark.

9. A method according to claim 7, wherein said processing step includes binary-coding the resultant signal and processing the resultant signal which is in the form of a binarized signal, in accordance with a ratio of peaks of the first and second signals, to determine the position of the mark.

10. A method of detecting a mark having first and second edges, comprising the steps of:

providing a mark signal formed by adding first and second signals related to the first and second edges of the mark, respectively; and determining the position of the mark on the basis of the mark signal and any difference between the first and second signals.

11. A device for detecting an alignment mark having first and second edges, said device comprising:

an illumination system for illuminating the alignment mark with radiation;

a converting system for detecting any radiation from the illuminated alignment mark, and for producing first and second signals related to the first and second edges of the mark, respectively;

an adding circuit for adding the first and second signals and for producing a resultant signal;

a detecting circuit for detecting peaks of the first and second signals, respectively;

a binary-coding circuit for binarizing the produced resultant signal to produce a binarized signal; and a determining circuit for processing the binarized signal produced from said binary-coding circuit in accordance with any difference in peak between the first and second signals as detected by said detecting circuit.

* * * * *

UNITED STATES PATENT AND TRADEMARK OFFICE
CERTIFICATE OF CORRECTION

PATENT NO. : 4,886,974                                    Page 1 of 3
DATED      : December 12, 1989
INVENTOR(S) : Hideki Ina It is certified that error appears in the above-identified patent and that said Letters Patent is hereby corrected as shown below:

ON THE COVER

IN THE REFERENCES CITED

"4,677,301 1/87 Tanimoto et al." should read
--4,677,301 6/87 Tanimoto et al.--.

IN THE DISCLOSURE:

COLUMN 3

Line 19, "is" should read --are--.

COLUMN 5

Line 15, "element" should be deleted.
Line 16, "mark 1a" should read
--mark element 1a--.

COLUMN 6

Line 18, "sections" should read --sections 8--.

COLUMN 7

Line 12, "of" should read --are-- and "are" should read --of--.

UNITED STATES PATENT AND TRADEMARK OFFICE
CERTIFICATE OF CORRECTION

PATENT NO. : 4,886,974

DATED : December 12, 1989

INVENTOR(S) : Hideki Ina

It is certified that error appears in the above-identified patent and that said Letters Patent is hereby corrected as shown below:

COLUMN 8

Line 54, "stored" should read --store--.
    Line 55, "form" should read --from--.

COLUMN 9

Line 2, "e" should read --be--.

COLUMN 10

Line 21, "occurs" should read --occur--.

COLUMN 11

Line 51, "center" should read --the center of which--.
    Line 52, "of which" should be deleted.

COLUMN 13

Line 14, "have" should read --has--.
    Line 49, "mony" should read --may--.

COLUMN 14

Line 40, "binary coded signal" should read --binary-coded signal--.

UNITED STATES PATENT AND TRADEMARK OFFICE
CERTIFICATE OF CORRECTION

PATENT NO. : 4,886,974

DATED : December 12, 1989

INVENTOR(S) : Hideki Ina

It is certified that error appears in the above-identified patent and that said Letters Patent is hereby corrected as shown below:

COLUMN 14

Line 40, "binary coded signal" should read --binary-coded signal--.

Signed and Sealed this

Seventeenth Day of September, 1991

Attest:

HARRY F. MANBECK, JR.

*Attesting Officer*              *Commissioner of Patents and Trademarks*